United States Patent
Stoica et al.

(10) Patent No.: US 12,218,679 B2
(45) Date of Patent: Feb. 4, 2025

(54) GAIN AND OFFSET DIAGNOSIS OF ANALOG-TO-DIGITAL CONVERTERS IN SENSOR SIGNAL PATH

(71) Applicant: Infineon Technologies AG, Neubiberg (DE)

(72) Inventors: Dan Ioan Dumitru Stoica, Bucharest (RO); Constantin Crisu, Bucharest (RO); Constantin Stroi, Bucharest (RO); Vlad Buiculescu, Bucharest (RO); Matthias Böhm, Putzbrunn (DE); Alessandro Caspani, Villach (AT); Cesare Buffa, Villach (AT); Franz Michael Darrer, Graz (AT)

(73) Assignee: Infineon Technologies AG, Neubiberg (DE)

( * ) Notice: Subject to any disclaimer, the term of this patent is extended or adjusted under 35 U.S.C. 154(b) by 208 days.

(21) Appl. No.: 18/146,641

(22) Filed: Dec. 27, 2022

(65) Prior Publication Data
US 2024/0213997 A1 Jun. 27, 2024

(51) Int. Cl.
| | |
|---|---|
| H03M 1/10 | (2006.01) |
| G10L 21/0232 | (2013.01) |
| H03M 1/06 | (2006.01) |
| H03M 1/34 | (2006.01) |

(52) U.S. Cl.
CPC .......... H03M 1/34 (2013.01); G10L 21/0232 (2013.01); H03M 1/0626 (2013.01)

(58) Field of Classification Search
USPC ........................................ 341/118–121, 155
See application file for complete search history.

(56) References Cited

U.S. PATENT DOCUMENTS

| | | | | |
|---|---|---|---|---|
| 5,570,028 | A * | 10/1996 | Sperlazzo | G01R 31/58 324/67 |
| 6,271,781 | B1 * | 8/2001 | Pellon | H03M 3/388 341/143 |
| 6,801,868 | B1 * | 10/2004 | Medelius | H03G 3/3026 702/107 |
| 6,927,717 | B1 * | 8/2005 | Oprescu | H03M 3/34 341/143 |

(Continued)

FOREIGN PATENT DOCUMENTS

| | | |
|---|---|---|
| CN | 114448435 A | 5/2022 |
| KR | 20160045601 A | 4/2016 |

*Primary Examiner* — Linh V Nguyen
(74) *Attorney, Agent, or Firm* — Harrity & Harrity, LLP

(57) ABSTRACT

A sensor circuit, having a startup phase and an operation phase, includes: a sensor configured to generate a sensor signal based on a measured property, wherein the sensor signal has a frequency spectrum defined by a first frequency and a second frequency that is greater than the first frequency; a signal processing circuit including an analog-to-digital converter (ADC) configured to convert the sensor signal into a digital sensor signal; and an offset diagnosis circuit. The offset diagnosis circuit includes: a low pass filter having a cutoff frequency less than the first frequency and configured to generate a filtered signal based on the digital sensor signal; an offset register configured to store a startup signal value of the filtered signal during the startup phase; and an offset comparator circuit configured to set a threshold range based on the startup signal value for use during the operation phase.

25 Claims, 4 Drawing Sheets

(56) References Cited

U.S. PATENT DOCUMENTS

| | | | |
|---|---|---|---|
| 9,774,343 B1 | 9/2017 | Liaghati | |
| 9,960,779 B2* | 5/2018 | Funato | H03M 1/1057 |
| 9,983,032 B1* | 5/2018 | Kraver | G01R 27/26 |
| 11,549,973 B1* | 1/2023 | Corredoura | G01R 19/2503 |
| 2015/0188555 A1* | 7/2015 | Kimura | H03M 1/002 |
| | | | 341/118 |
| 2015/0365118 A1* | 12/2015 | Khan | H03G 3/3068 |
| | | | 375/345 |
| 2016/0211861 A1* | 7/2016 | Op 't Eynde | H03M 1/1038 |
| 2019/0207622 A1* | 7/2019 | Tanaka | H03M 3/474 |
| 2021/0173042 A1* | 6/2021 | Wu | G01S 7/356 |
| 2022/0263514 A1 | 8/2022 | Rivas-Rivera et al. | |

* cited by examiner

GAIN AND OFFSET DIAGNOSIS OF ANALOG-TO-DIGITAL CONVERTERS IN SENSOR SIGNAL PATH

BACKGROUND

Analog-to-digital converts (ADCs) are used to convert an analog signal from an analog domain into a digital signal in a digital domain. ADCs are used in many applications, including sensor applications. In sensor applications, a sensor is configured to generate a sensor signal based on a sensed property and an ADC may be used to sample the sensor signal to generate digital samples of the sensor signal that are subsequently processed by digital signal processing to obtain measurements of the sensed property.

SUMMARY

In some implementations, a sensor circuit having a startup phase and an operation phase subsequent to the startup phase includes a sensor configured to measure a property and generate a sensor signal based on the property, wherein the sensor signal has a frequency spectrum defined by a first frequency that is greater than zero and a second frequency that is greater than the first frequency; a signal processing circuit comprising an analog-to-digital converter (ADC) configured to convert the sensor signal into a digital sensor signal; and an offset diagnosis circuit coupled to an output of the ADC, wherein the offset diagnosis circuit comprises: a first low pass filter having a first cutoff frequency less than the first frequency and configured to generate a first filtered signal based on the digital sensor signal; an offset register configured to store a first startup signal value of the first filtered signal during the startup phase; and an offset comparator circuit configured to set a first threshold range based on the first startup signal value and, during the operation phase, compare the first filtered signal with the first threshold range and generate a first error signal on a condition that the first filtered signal does not satisfy the first threshold range during the operation phase.

In some implementations, a sensor circuit having a startup phase and an operation phase subsequent to the startup phase includes a sensor configured to measure a property and generate a sensor signal based on the property, wherein the sensor signal has a frequency spectrum defined by a first frequency and a second frequency that is greater than the first frequency; a signal processing circuit comprising an analog-to-digital converter (ADC); and a signal generator configured to inject a stimulus signal into the sensor circuit upstream from the ADC such that the stimulus signal is superimposed onto the sensor signal to generate a combined signal received by the ADC, wherein the stimulus signal has a third frequency that is greater than the second frequency, and wherein the ADC is configured to convert the combined signal into a digital combined signal; and a gain diagnosis circuit coupled to an output of the ADC, wherein the gain diagnosis circuit comprises: a demodulator configured to generate a baseband signal based on the digital combined signal and a defined correlation with the stimulus signal; a first low pass filter having a first cutoff frequency configured to filter out frequency components corresponding to the sensor signal, wherein the first low pass filter is configured to receive the baseband signal and generate a first filtered signal based on the baseband signal; a gain register configured to store a first startup signal value of the first filtered signal during the startup phase; and a gain comparator circuit configured to set a first threshold range based on the first startup signal value and, during the operation phase, compare the first filtered signal with the first threshold range and generate a first error signal on a condition that the first filtered signal does not satisfy the first threshold range during the operation phase.

In some implementations, a method includes operating a sensor circuit in a startup phase and an operation phase subsequent to the startup phase, wherein operating the sensor circuit in the startup phase comprises: generating a first sensor signal based on a measured property, wherein the first sensor signal has a first frequency spectrum within a predetermined bandwidth defined by a first frequency and a second frequency that is greater than the first frequency; converting the first sensor signal into a first digital sensor signal; generating, based on the first digital sensor signal, a first filtered signal by a low pass filter having a cutoff frequency that is less than the first frequency; storing a startup signal value of the first filtered signal; and setting a threshold range based on the startup signal value, and wherein operating the sensor circuit in the operation phase comprises: generating a second sensor signal based on the measured property, wherein the second sensor signal has a second frequency spectrum within the predetermined bandwidth; converting the second sensor signal into a second digital sensor signal; generating, based on the second digital sensor signal, a second filtered signal by the low pass filter having the cutoff frequency; comparing the second filtered signal with the threshold range; and generating an error signal on a condition that the second filtered signal does not satisfy the threshold range.

In some implementations, a method includes operating a sensor circuit in a startup phase and an operation phase subsequent to the startup phase, wherein operating the sensor circuit in the startup phase comprises: generating a first sensor signal based on a measured property, wherein the first sensor signal has a first frequency spectrum within a predetermined bandwidth defined by a first frequency and a second frequency that is greater than the first frequency; injecting a first stimulus signal into the sensor circuit such that the first stimulus signal is superimposed onto the first sensor signal to generate a first combined signal, wherein the first stimulus signal has a third frequency that is greater than the second frequency; converting the first combined signal into a first digital combined signal; generating a first baseband signal based on the first digital combined signal and a first defined correlation with the first stimulus signal; generating, based on the first baseband signal, a first filtered signal by a low pass filter having a cutoff frequency configured to filter out frequency components corresponding to the first sensor signal; storing a startup signal value of the first filtered signal; and setting a threshold range based on the startup signal value, wherein operating the sensor circuit in the operation phase comprises: generating a second sensor signal based on the measured property, wherein the second sensor signal has a second frequency spectrum within the predetermined bandwidth; injecting a second stimulus signal into the sensor circuit such that the second stimulus signal is superimposed onto the second sensor signal to generate a second combined signal, wherein the second stimulus signal has the third frequency; converting the second combined signal into a second digital combined signal; generating a second baseband signal based on the second digital combined signal and a second defined correlation with the second stimulus signal; generating, based on the second baseband signal, a second filtered signal by the low pass filter having the cutoff frequency; comparing the second filtered signal with the threshold range; and generating an error signal on a condition that the second filtered signal does not satisfy the threshold range.

BRIEF DESCRIPTION OF THE DRAWINGS

Implementations are described herein making reference to the appended drawings.

DETAILED DESCRIPTION

Figure 1:
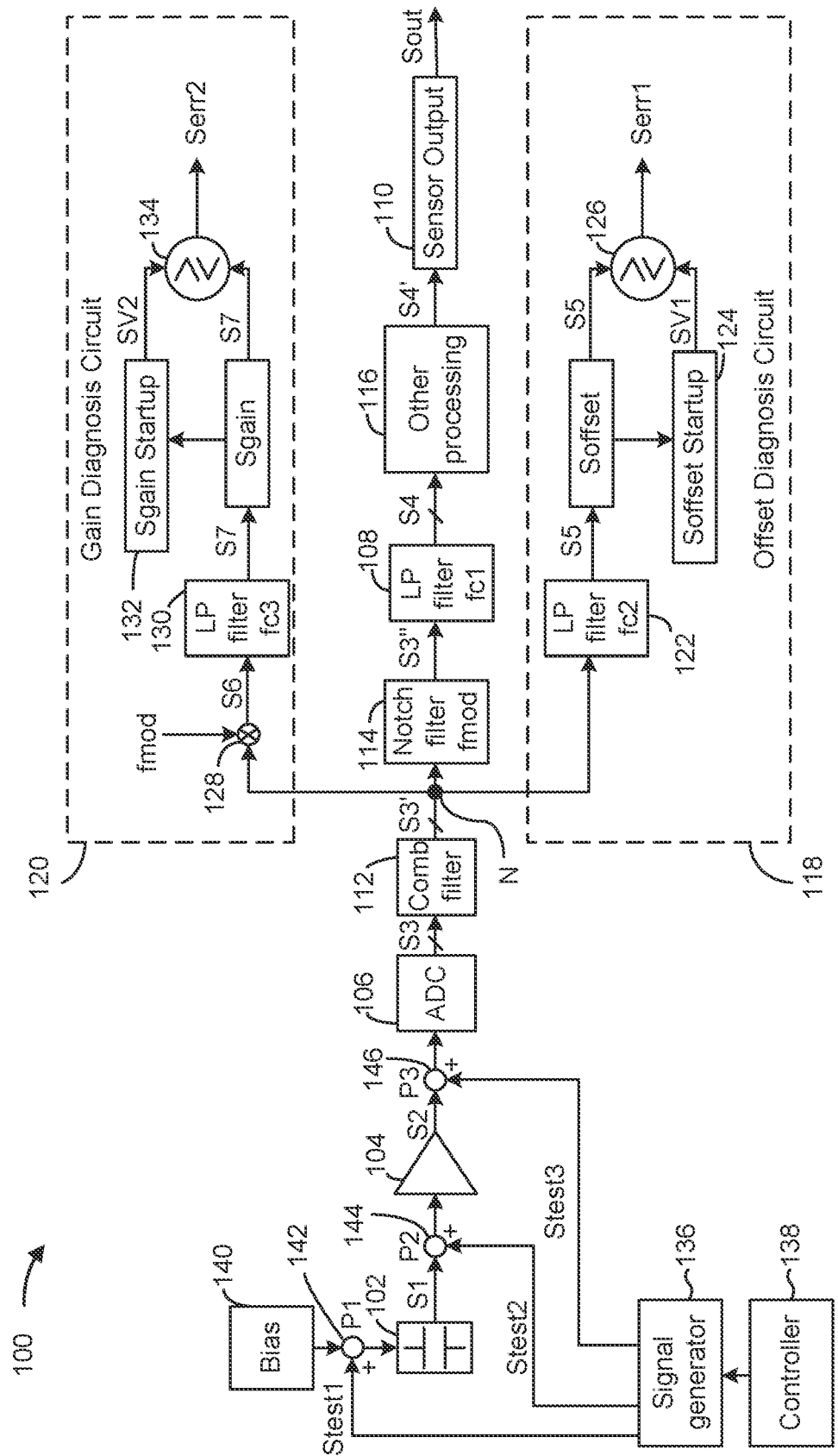
FIG. 1 shows a sensor circuit according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top," "bottom," "below," "above," "front," "behind," "back," "leading," "trailing," etc., may be used with reference to an orientation of the figures being described. Because parts of the implementations, described herein, can be positioned in a number of different orientations, the directional terminology is used for purposes of illustration and is in no way limiting. It is to be understood that other implementations may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, e.g., any connection or coupling without additional intervening elements, may also be implemented by an indirect connection or coupling, e.g., a connection or coupling with one or more additional intervening elements, or vice versa, as long as the general purpose of the connection or coupling, for example, to transmit a certain kind of signal or to transmit a certain kind of information, is essentially maintained.

Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, an approximate signal value may practically have a signal value within 5% of the approximate signal value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

A sensor may refer to a component which converts a property to be measured to an electric signal, for example, a current signal or a voltage signal. The property may, for example, comprise a magnetic field, an electric field, an electromagnetic wave (e.g., a radio wave), a pressure, a force, a current, or a voltage, but is not limited thereto. There are many sensor applications in which the signals of interest are in a certain limited bandwidth defined by a first frequency f1 as a lower limit and a second frequency f2 as an upper limit. For example, a useful frequency band for audible audio signals is approximately 20 Hz to 20 kHz. Thus, for an acoustic sensor, the property is an acoustic wave. The acoustic sensor may be used as a microphone sensor to sense audible sound waves. For example, a capacitive sensor element with a flexible membrane may be used to sense audible sound waves, which cause the flexible membrane to vibrate. As the flexible membrane vibrates, a capacitance of the capacitive sensor element changes, which can be read out as a measurement of the audible sound wave.

An analog-to-digital converter (ADC) may be used to sample a sensor signal generated by a sensor element of a sensor and generate digital samples of the sensor signal that are subsequently processed by digital signal processing to obtain measurements of the sensed property. ADCs used in different types of sensors can make up a large part of an available area of an integrated circuit (e.g., an available area of a sensor chip).

Random failures of one or more components of the ADC may affect the analog-to-digital conversion. For example, the random failures may affect one or more internal capacitances of the ADC or one or more internal references used by the ADC to perform the analog-to-digital conversion. The random failures that may occur in the ADC may substantially change the offset and the gain of the ADC, resulting in offset errors and/or gain errors at the output of the ADC. The offset errors and/or gain errors may result in erroneous information being output by the sensor at a sensor output, which causes an external device to receive the erroneous information.

On the other hand, during normal operation, each ADC operates within an expected offset spread and an expected gain spread that is acceptable. The actual offset or the actual gain of the ADC may vary within the expected offset spread and the expected gain spread and still be considered acceptable. However, the expected offset spread and the expected gain spread of the ADC may vary due to various drift effects, such as manufacturing processing effects, temperature effects, or aging effects. Because the expected offset spread and the expected gain spread of the ADC may differ in comparison to other ADCs and may change over time, for example, due to temperature effects and aging effects, it may be difficult to differentiate between random failures occurring during operation of the ADC (e.g., due to faulty behavior) and deviations in the offset and the gain that occur normally within the expected offset spread and the expected gain spread.

In addition, faults occurring inside a signal processing chain of a sensor often result in a gain error and/or an offset error. While these faults may include the random failures that may occur within the ADC, the faults may also include other faults that occur within other components of the signal processing chain. Therefore, it may be difficult to determine an error source within the signal processing chain, since one or more components of the signal processing chain may contribute to the gain error and/or the offset error.

Some implementations disclosed herein are directed to detecting faults in a signal processing chain of a sensor during operation of the sensor. The faults can be detected in sensor applications in which a signal of interest is in a certain limited bandwidth. As a result of the certain limited bandwidth, a sensor signal generated by the sensor has a frequency spectrum within a predetermined bandwidth defined by a first frequency f1 and a second frequency f2 that is greater than the first frequency. For example, in acoustic sensor applications, the first frequency f1 may be in a range of 16 Hz to 300 Hz and the second frequency f2 may be in a range of 3 kHz to 20 kHz. In some implementations, the frequency spectrum of the sensor signal is defined by the first frequency f1 and the second frequency f2. The certain limited bandwidth of the signal of interest enables an output of an ADC to be evaluated by diagnostic circuitry for an offset error and/or a gain error.

Some implementations may include an offset diagnosis path implemented in a digital domain and configured to detect an offset error. The offset diagnosis path may be coupled to the output of the ADC of the signal processing chain to detect offset changes for detecting the offset error. To avoid misinterpreting expected (e.g., normal) offset spread as a fault, the offset diagnosis path is configured to determine a startup value of the offset during a startup phase of the sensor, record the startup value of the offset, and use the startup value of the offset to determine a threshold range for detecting offset errors based on the startup value of the offset. The offset diagnosis path may then use the threshold range during an operation phase of the sensor to monitor for and detect the offset error. The threshold range may correspond to an actual expected offset spread, taking into account a current state of the sensor, including any drift effects. Because the startup value of the offset is used to determine the threshold range for detecting the offset errors, the offset diagnosis path is able to factor in the actual expected offset spread to differentiate between random failures occurring during operation of the ADC (e.g., due to faulty behavior) and deviations in the offset that occur normally within the actual expected offset spread. Detecting the offset error may enable the sensor to enter a safe state and to communicate with an external device that a sensor output is not reliable. Communicating with the external device that the sensor output is not reliable may prevent the external device from using faulty information from the sensor.

Additionally, or alternatively, some implementations may include a gain diagnosis path implemented in a digital domain and configured to detect a gain error. The gain diagnosis path may be coupled to the output of the ADC of the signal processing chain to detect gain changes for detecting the gain error. To avoid misinterpreting expected (e.g., normal) gain spread as a fault, the gain diagnosis path is configured to determine a startup value of the gain during the startup phase of the sensor, record the startup value of the gain, and use the startup value of the gain to determine a threshold range for detecting gain errors based on the startup value of the gain. The gain diagnosis path may then use the threshold range during the operation phase of the sensor to monitor for and detect the gain error. The threshold range may correspond to an actual expected gain spread, taking into account the current state of the sensor, including any drift effects. Because the startup value of the gain is used to determine the threshold range for detecting the gain errors, the gain diagnosis path is able to factor in the actual expected gain spread to differentiate between random failures occurring during operation of the ADC (e.g., due to faulty behavior) and deviations in the gain that occur normally within the actual expected gain spread. Detecting the gain error may enable the sensor to enter a safe state and to communicate with an external device that a sensor output is not reliable. Communicating with the external device that the sensor output is not reliable may prevent the external device from using faulty information from the sensor.

FIG. 1 shows a sensor circuit 100 according to one or more implementations. The sensor circuit 100 may be implemented on a single semiconductor chip or die (e.g., a single integrated circuit). The sensor circuit 100 may include a sensor 102, a buffer 104, an ADC 106, a main filter 108, and a sensor output 110 that are arranged in series along a sensor signal path.

The sensor 102 is configured to generate a sensor signal S1 based on measured property. For example, the sensor 102 may be configured to measure a property that has a target frequency band (e.g., a target frequency range) of a certain limited bandwidth defined by a first frequency f1 as a lower limit of the certain limited bandwidth and a second frequency f2 as an upper limit of the certain limited bandwidth. As a result, the sensor signal S1 generated by the sensor 102 has a frequency spectrum within a predetermined bandwidth defined by the first frequency f1 and the second frequency f2. In other words, each frequency component of the sensor signal S1 may be located within the predetermined bandwidth.

The sensor signal S1 may have a frequency, a plurality of frequencies, or a range of frequencies within the predetermined bandwidth. For example, in acoustic sensor applications, the first frequency f1 may be a frequency in a range of 16 Hz to 300 Hz and the second frequency f2 may be a frequency in a range of 3 kHz to 20 kHz. Thus, the sensor signal S1, representative of an acoustic wave, may have frequency components within the predetermined bandwidth defined by the first frequency f1 as the lower limit of the predetermined bandwidth and the second frequency f2 as the upper limit of the predetermined bandwidth. Thus, in some implementations, the sensor 102 may be a microphone sensor or some other type of acoustic sensor. In some implementations, the first frequency f1 may be zero. In other implementations, the first frequency f1 may be greater than zero.

In some implementations, the frequency spectrum of the sensor signal S1 is defined by the first frequency f1 and the second frequency f2. In other words, over time, the sensor signal S1 may include a first frequency component equal to or approximately equal to the first frequency f1 and a second frequency component equal to or approximately equal to the second frequency f2, with possible additional frequency components between the first frequency f1 and the second frequency f2. The predetermined bandwidth in which the frequency spectrum of the sensor signal S1 resides may enable an output of the ADC 106 to be evaluated by diagnostic circuitry for an offset error and/or a gain error.

The buffer 104, the ADC 106, and the main filter 108 form a signal processing chain that extends along the sensor signal path. The signal processing chain is configured to process the sensor signal S1 using one or more signal processing and/or signal conditioning techniques to generate a sensor output signal Sout for output at the sensor output 110. The sensor output signal Sout is a digital signal that is representative of the sensor signal S1. In other words, the sensor output signal Sout is a digital measurement of the property configured to be sensed by the sensor 102.

The signal processing chain may include additional components, such as a comb filter 112, a notch filter 114, and/or a further signal conditioning component 116, that are configured to perform additional signal conditioning on the sensor signal S1 or signals derived from the sensor signal S1. Signal conditioning, as used herein, refers to manipulating an analog signal or a digital signal in such a way that the signal meets requirements of a next stage for further processing or conditioning. Signal conditioning may include converting from analog to digital (e.g., via an analog-to-digital converter), amplification, filtering, converting, biasing, range matching, isolation, linearization, or any other processes used to make a sensor output suitable for processing after conditioning.

The buffer 104, located downstream from the sensor 102 along the sensor signal path, is configured to transfer the sensor signal S1 from the sensor 102 to the rest of signal processing chain. Thus, the buffer 104 may be a first component of the signal processing chain. In some implementations, the buffer 104 may be a buffer amplifier that is configured to amplify the sensor signal S1 in order to make the sensor signal S1 more suitable for the ADC 106. The buffer 104 is configured to output a buffered signal S2, which corresponds to or is representative of the sensor signal S1. In other words, the buffered signal S2 is based on the sensor signal S1.

The ADC 106, located downstream from the buffer 104 along the sensor signal path, is configured to convert an output of the buffer 104 into a digital signal S3 (e.g., a digital sensor signal). The digital signal S3 corresponds to or is representative of the sensor signal S1. In other words, the digital signal S3 is based on the sensor signal S1. For example, the ADC 106 may be configured with a sampling rate at which the output of the buffer 104 is sampled and may be configured to generate the digital signal S3 comprised of digital samples generated at the sampling rate. The digital signal S3 may be provided to a signal node N that is coupled to an output of the ADC 106 and to an input of the main filter 108.

The main filter 108, located downstream from the ADC 106 along the sensor signal path, is coupled to the signal node N and is configured to attenuate or otherwise filter out unwanted frequency components (e.g., noise) that may be present in the digital signal S3. In some implementations, the main filter 108 is a low pass (LP) filter that has a cutoff frequency fc1 that is greater than the second frequency f2. Thus, signal components (e.g., frequency components) of the sensor signal S1 are passed through the main filter 108 in a filtered signal S4. The filtered signal S4 may be provided to the sensor output 110 and may be output as the sensor output signal Sout.

In some implementations, the comb filter 112 may be provided downstream from the ADC 106 along the sensor signal path as part of the signal processing chain. For example, the comb filter 112 may be used to provide anti-aliasing functionality before down sampling, such that the rest of the signal path can be operated at a lower sampling frequency to reduce area and current consumption. The comb filter 112 is configured to output a digital signal S3' that has been filtered by the comb filter 112. It will be appreciated that, while implementations may describe the signal node N as receiving the digital signal S3, that the signal node may receive the digital signal S3' or another signal derived from the digital signal S3 through signal conditioning.

In some implementations, the notch filter 114 may be provided downstream from the ADC 106 along the sensor signal path as part of the signal processing chain. For example, the notch filter 114 may be used to attenuate or otherwise filter out unwanted frequency components at a certain frequency or within a certain frequency band. For example, as will be described in further detail below, the notch filter 114 may be used to attenuate a modulated frequency fmod of a stimulus signal that may be injected into the sensor signal path for performing gain error monitoring and detection. In some implementations, the notch filter 114 may be combined with the comb filter 112 described above, as the anti-aliasing functionality of the comb filter 112 can also be obtained with notches at selected frequencies. The notch filter 114 is configured to output a digital signal S3" that has been filtered by the notch filter 114.

In some implementations, the further signal conditioning component 116 may be provided downstream from the main filter 108 along the sensor signal path as part of the signal processing chain. The further signal conditioning component 116 is configured to perform additional signal conditioning on the filtered signal S4 prior to being output from the sensor output 110. For example, the further signal conditioning component 116 may perform linearization or another type of signal conditioning on the filtered signal S4 to generate a processed signal S4'. Additionally, or alternatively, the further signal conditioning component 116 may include a digital-to-analog converter (DAC) that is configured to convert a signal (e.g., the filtered signal S4 or a linearized signal derived from the filtered signal S4) into an analog signal and provide the analog signal as the processed signal S4'. The further signal conditioning component 116 may provide the processed signal S4' to the sensor output 110 for output as the sensor output signal Sout.

The sensor circuit 100 may further include an offset diagnosis circuit 118 configured to monitor for and detect an offset error and/or a gain diagnosis circuit 120 configured to monitor for and detect a gain error. The sensor circuit 100 may be operated in a startup phase (e.g., an initialization phase) and an operation phase that is subsequent to the startup phase. For example, during initial startup (e.g., power on) of the sensor circuit 100, the sensor circuit 100 may be configured in the startup phase. The startup phase may correspond to a predetermined interval that follows the power on of the sensor circuit 100, to allow for sufficient settling time and during which one or more components of the sensor circuit 100 may be configured. For example, the offset diagnosis circuit 118 and the gain diagnosis circuit 120 may be configured into a preconfigured state (e.g., a preconfigured setting) during the startup phase. The operation phase follows startup phase and corresponds to a normal operation of the sensor circuit 100 during which the components configured during the startup phase are operated in their preconfigured states.

The offset diagnosis circuit 118 is coupled to the output of the ADC 106 at the signal node N. The offset diagnosis circuit 118 may include a first low pass filter 122, an offset register 124, and an offset comparator circuit 126. The first low pass filter 122 has a cutoff frequency fc2 that less than the first frequency f1. Thus, in order to perform monitoring for the offset error, the first frequency f1 should be greater than zero so that the cutoff frequency fc2 can be set between zero and the first frequency f1. For audio applications, the cutoff frequency fc2 may be set to less than 20 Hz (e.g., 5-10 Hz). The human ear add additional filtering below 20 Hz and above 20 kHz.

The first low pass filter 122 is configured to output a first filtered signal S5. The first filtered signal S5 is the offset or an approximate representation of the offset. Thus, the first filtered signal S5 can be used as an offset measurement Soffset of a portion of the sensor signal path that is upstream from the signal node N.

During the startup phase, the first filtered signal S5 is provided to the offset register 124 (e.g., a memory device), which stores the first filtered signal S5 as a first startup signal value SV1. Thus, the first startup signal value SV1 may be used as an offset value of the portion of the sensor signal path that is upstream from the signal node N, and that which is recorded during the startup phase. The offset comparator circuit 126 receives the first startup signal value SV1 during the startup phase and uses the first startup signal value SV1 to set a first threshold range based on the first startup signal value SV1. For example, the first threshold range may be defined by a first threshold and a second threshold, and the offset comparator circuit 126 may set the first threshold to a threshold value that is greater than the first startup signal value SV1 by a first predetermined difference and a set the second threshold to a threshold value that is less than the first startup signal value SV1 by a second predetermined difference.

The first threshold range may correspond to an actual expected offset spread of the portion of the sensor signal path that is upstream from the signal node N. For example, the first threshold range may correspond to the actual expected offset spread of the ADC 106. As a result of the first startup signal value SV1 being measured during the startup phase and being used to set the first threshold range, an actual state of the ADC 106, including any drift effects, can be taken into account for monitoring for the offset error. In other words, the offset comparator circuit 126 can be configured during the startup phase to account for the drift effects that may otherwise make it difficult to differentiate between random failures occurring during operation of the ADC 106 or another component of the sensor signal path (e.g., due to faulty behavior) and deviations in the offset that occur normally within the actual expected offset spread.

During the operation phase, the offset comparator circuit 126 is configured to receive the first filtered signal S5 from the first low pass filter 122 as a measurement of the offset, compare the first filtered signal S5 with the first threshold range, and generate a first error signal Serr1 on a condition that the first filtered signal S5 does not satisfy the first threshold range during the operation phase. The offset comparator circuit 126 may be configured to continuously compare the first filtered signal S5 with the first threshold range or compare the first filtered signal S5 with the first threshold range at regular intervals. For example, the offset comparator circuit 126 may generate the first error signal Serr1, indicating a fault, if the first filtered signal S5 is determined to be outside of or otherwise exceeding the first threshold range. On the other hand, the offset comparator circuit 126 may generate a first OK signal as long as the first filtered signal S5 satisfies the first threshold range during the operation phase, indicating that the first filtered signal S5 is within the first threshold range (e.g., the actual expected offset spread).

The gain diagnosis circuit 120 is coupled to the output of the ADC 106 at the signal node N. The gain diagnosis circuit 120 may include a demodulator 128, a second low pass filter 130, a gain register 132 (e.g., a memory device), and a gain comparator circuit 134. In addition, the sensor circuit 100 may include a signal generator 136 and a controller 138 that are configured to operate with the gain diagnosis circuit 120 to monitor for the gain error. In some implementations, the signal generator 136 and the controller 138 may be regarded as part of the gain diagnosis circuit 120.

The signal generator 136 is configured to inject a first stimulus signal Stest1, a second stimulus signal Stest2, or a third stimulus signal Stest3 into the sensor circuit 100 upstream from the ADC 106 such that the stimulus signal is superimposed onto the sensor signal S1 to generate a combined signal received by the ADC 106. Each stimulus signal of the first stimulus signal Stest1, the second stimulus signal Stest2, and the third stimulus signal Stest3 has a modulation frequency fmod (e.g., a third frequency) that is greater than the second frequency f2. In some implementations, the modulation frequency fmod may be synchronized with a sampling frequency of the ADC 106 to avoid intermodulation effects from an injected stimulus signal (e.g., Stest1, Stest2, or Stest3) appearing in the predetermined bandwidth of the sensor signal S1.

The first stimulus signal Stest1, the second stimulus signal Stest2, and the third stimulus signal Stest3 may be a substantially similar stimulus signal with the same modulation frequency fmod that are injected at different injection points P1, P2, and P3, respectively, in the sensor circuit 100. In some implementations, the first stimulus signal Stest1, the second stimulus signal Stest2, and the third stimulus signal Stest3 may be different stimulus signals having one or more different signal characteristics. Nevertheless, each stimulus signal of the first stimulus signal Stest1, the second stimulus signal Stest2, and the third stimulus signal Stest3 is generated at a frequency that is greater than the second frequency f2. As a result, the frequency spectrum of the sensor signal S1 may be referred to as a first frequency spectrum, and each stimulus signal Stest1, Stest2, and Stest3 has a second frequency spectrum that is entirely outside the first frequency spectrum of the sensor signal S1.

The controller 138 may be configured to control one or more signal characteristics of the first stimulus signal Stest1, the second stimulus signal Stest2, and third stimulus signal Stest3. In addition, the controller 138 may control which of the first stimulus signal Stest1, the second stimulus signal Stest2, or third stimulus signal Stest3 is injected into the sensor circuit 100. By selecting amongst the different injection points P1, P2, and P3, different components or combinations of components of the sensor circuit 100 may be included in the monitoring of the gain, while other components may be excluded from the monitoring of the gain. As a result, the gain diagnosis circuit 120 may be able to determine which of the different components are faulty if the gain error is detected by ruling out or isolating one component from the other different components of the sensor circuit 100.

The sensor circuit 100 may include a voltage source 140 configured to provide an input bias voltage to the sensor 102. For example, the input bias voltage may be an DC bias voltage that is configured to establish an initial operating condition of the sensor 102. The sensor circuit 100 may include a first combiner circuit 142 positioned at the first injection point P1. The first combiner circuit 142 is configured to receive the input bias voltage and the first stimulus signal Stest1 and combine (e.g., add) the input bias voltage and the first stimulus signal Stest1. Accordingly, the first stimulus signal Stest1 is superimposed onto the input bias voltage at an input of the sensor 102. The first stimulus signal Stest1 influences the output of the sensor 102 such that the first stimulus signal Stest1 is superimposed onto the sensor signal S1. In other words, the first stimulus signal Stest1 is superimposed onto a measurement of the property sensed by the sensor 102 and the sensor signal S1 is a combination of the measurement of the property sensed by the sensor 102 and the first stimulus signal Stest1. In a case that the first stimulus signal Stest1 is injected into the sensor circuit 100, the sensor signal S1 may be referred to as a combined signal. The first injection point P1 enables the components downstream from the first injection point P1, including the sensor 102, the buffer 104, and the ADC 106, to be included in the monitoring of the gain.

The sensor circuit 100 may include a second combiner circuit 144 positioned at the second injection point P2. The second combiner circuit 144 is configured to receive the sensor signal S1 and the second stimulus signal Stest2 and combine (e.g., add) the sensor signal S1 and the second stimulus signal Stest2 to generate a combined signal. Accordingly, the second stimulus signal Stest2 is superimposed onto the sensor signal S1 at an output of the sensor 102. In other words, the second stimulus signal Stest2 is superimposed onto a measurement of the property sensed by the sensor 102 and the second combiner circuit 144 is configured to output the combined signal. The second injection point P2 enables the components downstream from the second injection point P2, including the buffer 104 and the ADC 106, to be included in the monitoring of the gain. However, the sensor 102 is excluded from the monitoring of the gain when the second injection point P2 is used to inject the second stimulus signal Stest2.

The sensor circuit 100 may include a third combiner circuit 146 positioned at the third injection point P3. The third combiner circuit 146 is configured to receive the buffered signal S2 and the third stimulus signal Stest3 and combine (e.g., add) the buffered signal S2 and the third stimulus signal Stest3 to generate a combined signal. Accordingly, the third stimulus signal Stest3 is superimposed onto the buffered signal S2 at an output of the buffer 104. In other words, the third stimulus signal Stest3 is superimposed onto a measurement of the property sensed by the sensor 102 and the third combiner circuit 146 is configured to output the combined signal. The third injection point P3 enables the components downstream from the third injection point P3, including the ADC 106, to be included in the monitoring of the gain. However, the sensor 102 and the buffer 104 are excluded from the monitoring of the gain when the third injection point P3 is used to inject the third stimulus signal Stest3.

As noted above, the first stimulus signal Stest1, the second stimulus signal Stest2, or the third stimulus signal Stest3 are injected into the sensor circuit 100 upstream from the ADC 106. By injecting one of the first stimulus signal Stest1, the second stimulus signal Stest2, or the third stimulus signal Stest3 into the sensor signal path upstream from the ADC 106, at the very least, the ADC 106 can be evaluated by the gain diagnosis circuit 120 for the gain error. The ADC 106 is configured to convert one of the combined signals, which includes frequency components of the first stimulus signal Stest1, the second stimulus signal Stest2, or the third stimulus signal Stest3 corresponding to the modulation frequency fmod, into a digital combined signal. In other words, the digital combined signal includes signal components from the measured property located within the first frequency spectrum and further includes signal components from one of the stimulus signals Stest1, Stest2, or Stest3 located in the second frequency spectrum that is entirely outside the first frequency spectrum.

The notch filter 114 may be included in the sensor signal path to filter out the signal components (e.g., frequency components) of the injected stimulus signal (e.g., Stest1, Stest2, or Stest3). As a result, the notch filter 114 may ensure that the signal components from one of the stimulus signals Stest1, Stest2, or Stest3 are removed from the sensor output signal Sout in order to ensure that the sensor output signal Sout is an accurate representation of the measured property.

The demodulator 128 is coupled to the signal node N and is configured to receive the digital combined signal from the signal node N. The demodulator 128 may use a defined correlation with an injected stimulus signal (e.g., stimulus signal Stest1, Stest2, or Stest3) to demodulate or otherwise convert the digital combined signal into a baseband signal S6. The demodulation of the digital combined signal results in the injected stimulus signal being translated into DC signal components (e.g., DC values) representative of gain values. For example, the demodulator 128 may be a chopper configured with the modulation frequency fmod to demodulate the digital combined signal received from the signal node N. For example, the chopper may be configured with a demodulation signal that is in-phase with the injected stimulus signal and has a demodulation frequency equal to the modulation frequency fmod. Alternatively, the demodulator 128 may be a mixer that receives the demodulation signal and mixes the demodulation signal with the digital combined signal to generate the baseband signal S6. Thus, the demodulator 128 is configured to generate the baseband signal S6 based on the digital combined signal and the defined correlation with the injected stimulus signal.

The second low pass filter 130 has a cutoff frequency fc3 that is configured to filter out frequency components corresponding to the sensor signal S1 (e.g., frequency components derived from the measured property) from the baseband signal S6. In particular, after demodulation, the sensor signal S1 (e.g., frequency components derived from the measured property) may be located at a difference between the modulation frequency and the second frequency f2 (e.g., fmod−f2). Accordingly, the cutoff frequency fc3 may be set to less than the difference between the modulation frequency and the second frequency f2 in order to remove the frequency components corresponding to the sensor signal S1 (e.g., frequency components derived from the measured property). Thus, the second low pass filter 130 is configured to receive the baseband signal S6 and generate a second filtered signal S7 based on the baseband signal S6.

The second low pass filter 130 is configured to output the second filtered signal S7. The second filtered signal S7 is the gain or an approximate representation of the gain. Thus, the second filtered signal S7 can be used as a gain measurement Sgain of a portion of the sensor signal path that is upstream from the signal node N.

During the startup phase, the second filtered signal S7 is provided to the gain register 132 (e.g., a memory device), which stores the second filtered signal S7 as a second startup signal value SV2. Thus, the second startup signal value SV2 may be used as a gain value of the portion of the sensor signal path that is between the injection point and the signal node N, and that which is recorded during the startup phase. The gain comparator circuit 134 receives the second startup signal value SV2 during the startup phase and uses the second startup signal value SV2 to set a second threshold range based on the second startup signal value. For example, the second threshold range may be defined by a third threshold and a fourth threshold, and the gain comparator circuit 134 may set the third threshold to a threshold value that is greater than the second startup signal value SV2 by a third predetermined difference and a set the fourth threshold to a threshold value that is less than the second startup signal value SV2 by a fourth predetermined difference.

The second threshold range may correspond to an actual expected gain spread of the portion of the sensor signal path that is between the injection point and the signal node N. For example, the second threshold range may correspond to the actual expected offset spread of the ADC 106. As a result of the second startup signal value SV2 being measured during the startup phase and being used to set the second threshold range, an actual state of the ADC 106, including any drift effects, can be taken into account for monitoring for the gain error. In other words, the gain comparator circuit 134 can be configured during the startup phase to account for the drift effects that may otherwise make it difficult to differentiate between random failures occurring during operation of the ADC 106 or another component of the sensor signal path (e.g., due to faulty behavior) and deviations in the gain that occur normally within the actual expected gain spread.

During the operation phase, the gain comparator circuit 134 is configured to receive the second filtered signal S7 from the second low pass filter 130 as a measurement of the gain, compare the second filtered signal S7 with the second threshold range, and generate a second error signal Serr2 on a condition that the second filtered signal S7 does not satisfy the second threshold range during the operation phase. The gain comparator circuit 134 may be configured to continuously compare the second filtered signal S7 with the second threshold range or compare the second filtered signal S7 with the second threshold range at regular intervals. For example, the gain comparator circuit 134 may generate the second error signal Serr2, indicating a fault, if the second filtered signal S7 is determined to be outside of or otherwise exceeding the second threshold range. On the other hand, the gain comparator circuit 134 may generate a second OK signal as long as the second filtered signal S7 satisfies the second threshold range during the operation phase, indicating that the second filtered signal S7 is within the second threshold range (e.g., the actual expected gain spread).

If the gain error is detected, one or more of the stimulus signals (e.g., Stest1, Stest2, or Stest3) may be injected to discriminate which component of the sensor signal path is a faulty component. For example, the stimulus signals Stest1, Stest2, or Stest3 may be injected in an injection sequence to determined which of the components (e.g., the sensor 102, the buffer 104, or the ADC 106) is causing the gain error. The controller 138 may be configured to initiate the injection sequence after the gain error is detected by the gain comparator circuit 134.

In some implementations, the offset diagnosis circuit 118 and the gain diagnosis circuit 120 are configured to operate in parallel. However, in some implementations, only one of the offset diagnosis circuit 118 or the gain diagnosis circuit 120 is present or enabled for operation. In cases in which the offset diagnosis circuit 118 and the gain diagnosis circuit 120 are both operating, the first filtered signal S5 may be generated by the first low pass filter 122 based on the digital combined signal present at the signal node N. In cases in which the offset diagnosis circuit 118 is operating to perform offset monitoring, the first frequency f1 should be greater than zero to allow the cutoff frequency fc2 to be set between zero and the first frequency f1. However, in cases in which the offset diagnosis circuit 118 is not present or is not operating, the first frequency f1 may be zero. In other words, the gain diagnosis circuit 120 can operate with any range of frequencies defined by the first frequency f1 and the second frequency f2.

As indicated above, FIG. 1 is provided merely as an example. Other examples are possible and may differ from what was described with regard to FIG. 1. The number and arrangement of components shown in FIG. 1 are provided as an example. In practice, the sensor circuit 100 may include additional components, fewer components, different components, or differently arranged components than those shown in FIG. 1. Two or more components shown in FIG. 1 may be implemented within a single component, or a single component shown in FIG. 1 may be implemented as multiple, distributed components. Additionally, or alternatively, a set of components (e.g., one or more components) of the sensor circuit 100 may perform one or more functions described as being performed by another set of components of the sensor circuit 100.

Figure 2:
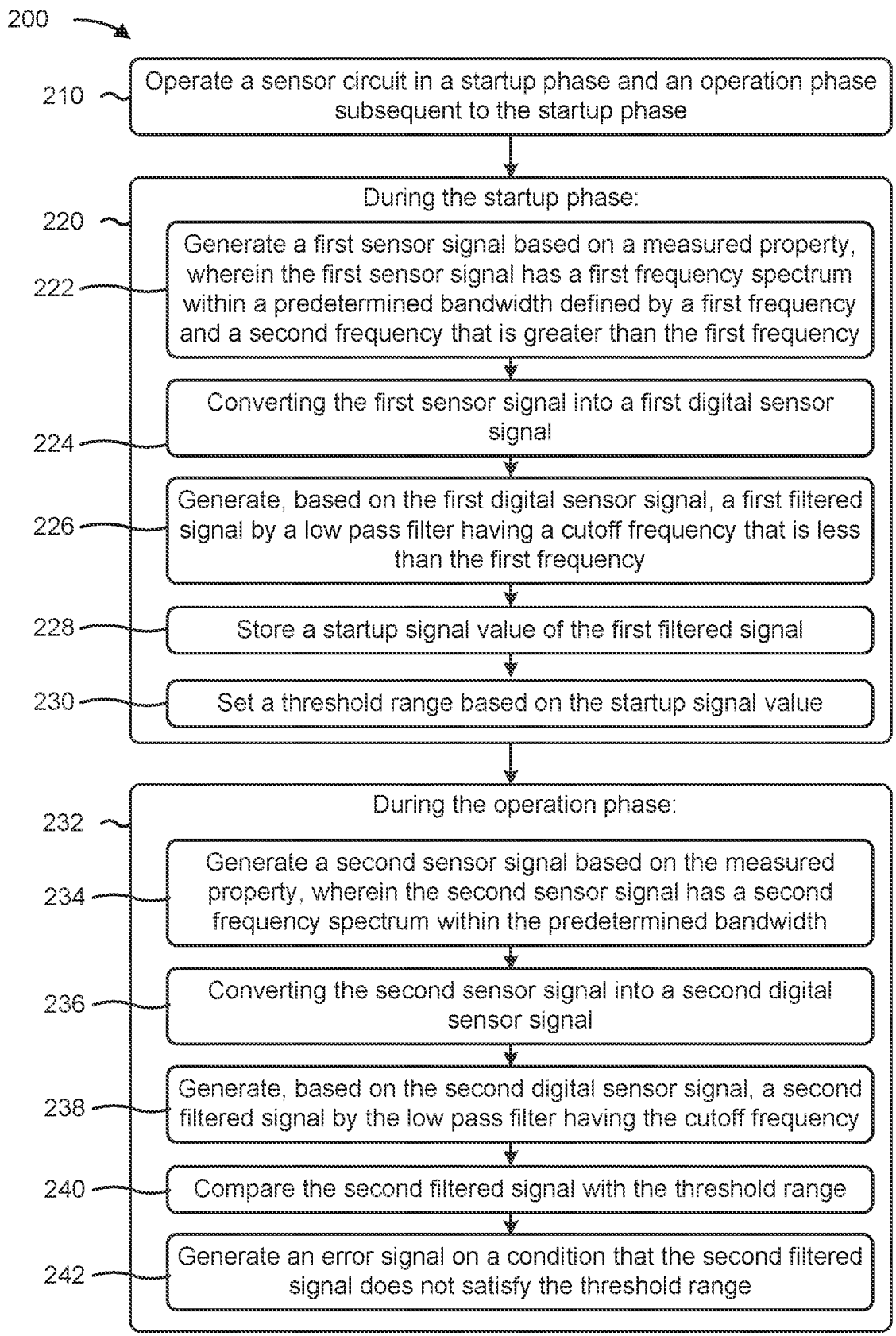
FIG. 2 is a flowchart of an example process associated with an offset diagnosis of a sensor signal path.

FIG. 2 is a flowchart of an example process 200 associated with an offset diagnosis of a sensor signal path. In some implementations, one or more process blocks of FIG. 2 are performed by a sensor circuit (e.g., sensor circuit 100). Additionally, or alternatively, one or more process blocks of FIG. 2 may be performed by one or more components of the sensor circuit 100, such as the sensor 102, the buffer 104, the ADC 106, the offset diagnosis circuit 118, and the controller 138.

As shown in FIG. 2, process 200 may include operating a sensor circuit in a startup phase and an operation phase subsequent to the startup phase (block 210). For example, the controller 138 may operate the sensor circuit 100 in a startup phase and an operation phase subsequent to the startup phase, as described above.

As further shown in FIG. 2, process 200 may include, during the startup phase (block 220), generating a first sensor signal based on a measured property, wherein the first sensor signal has a first frequency spectrum within a predetermined bandwidth defined by a first frequency and a second frequency that is greater than the first frequency (block 222); converting the first sensor signal into a first digital sensor signal (block 224); generating, based on the first digital sensor signal, a first filtered signal by a low pass filter having a cutoff frequency that is less than the first frequency (block 226); storing a startup signal value of the first filtered signal (block 228); and setting a threshold range based on the startup signal value (block 230).

For example, the sensor circuit 100 may operate the sensor 102, the signal processing chain, and the offset diagnosis circuit 118 in the startup phase, to perform the following: generate a first sensor signal based on a measured property, wherein the first sensor signal has a first frequency spectrum within a predetermined bandwidth defined by a first frequency and a second frequency that is greater than the first frequency; convert the first sensor signal into a first digital sensor signal; generate, based on the first digital sensor signal, a first filtered signal by a low pass filter having a cutoff frequency that is less than the first frequency; store a startup signal value of the first filtered signal; and set a threshold range based on the startup signal value, as described above.

As further shown in FIG. 2, process 200 may include, during the operation phase (block 232), generating a second sensor signal based on the measured property, wherein the second sensor signal has a second frequency spectrum within the predetermined bandwidth (block 234); converting the second sensor signal into a second digital sensor signal (block 236); generating, based on the second digital sensor signal, a second filtered signal by the low pass filter having the cutoff frequency (block 238); comparing the second filtered signal with the threshold range (block 240); and generating an error signal on a condition that the second filtered signal does not satisfy the threshold range (block 242).

For example, the sensor circuit 100 may operate the sensor 102, the signal processing chain, and the offset diagnosis circuit 118 in the operating phase, to perform the following: generate a second sensor signal based on the measured property, wherein the second sensor signal has a second frequency spectrum within the predetermined bandwidth; convert the second sensor signal into a second digital sensor signal; generate, based on the second digital sensor signal, a second filtered signal by the low pass filter having the cutoff frequency; compare the second filtered signal with the threshold range; and generate an error signal on a condition that the second filtered signal does not satisfy the threshold range, as described above.

Process 200 may include additional implementations, such as any single implementation or any combination of implementations described below and/or in connection with one or more other processes described elsewhere herein.

Although FIG. 2 shows example blocks of process 200, in some implementations, process 200 includes additional blocks, fewer blocks, different blocks, or differently arranged blocks than those depicted in FIG. 2. Additionally, or alternatively, two or more of the blocks of process 200 may be performed in parallel.

Figure 3A:
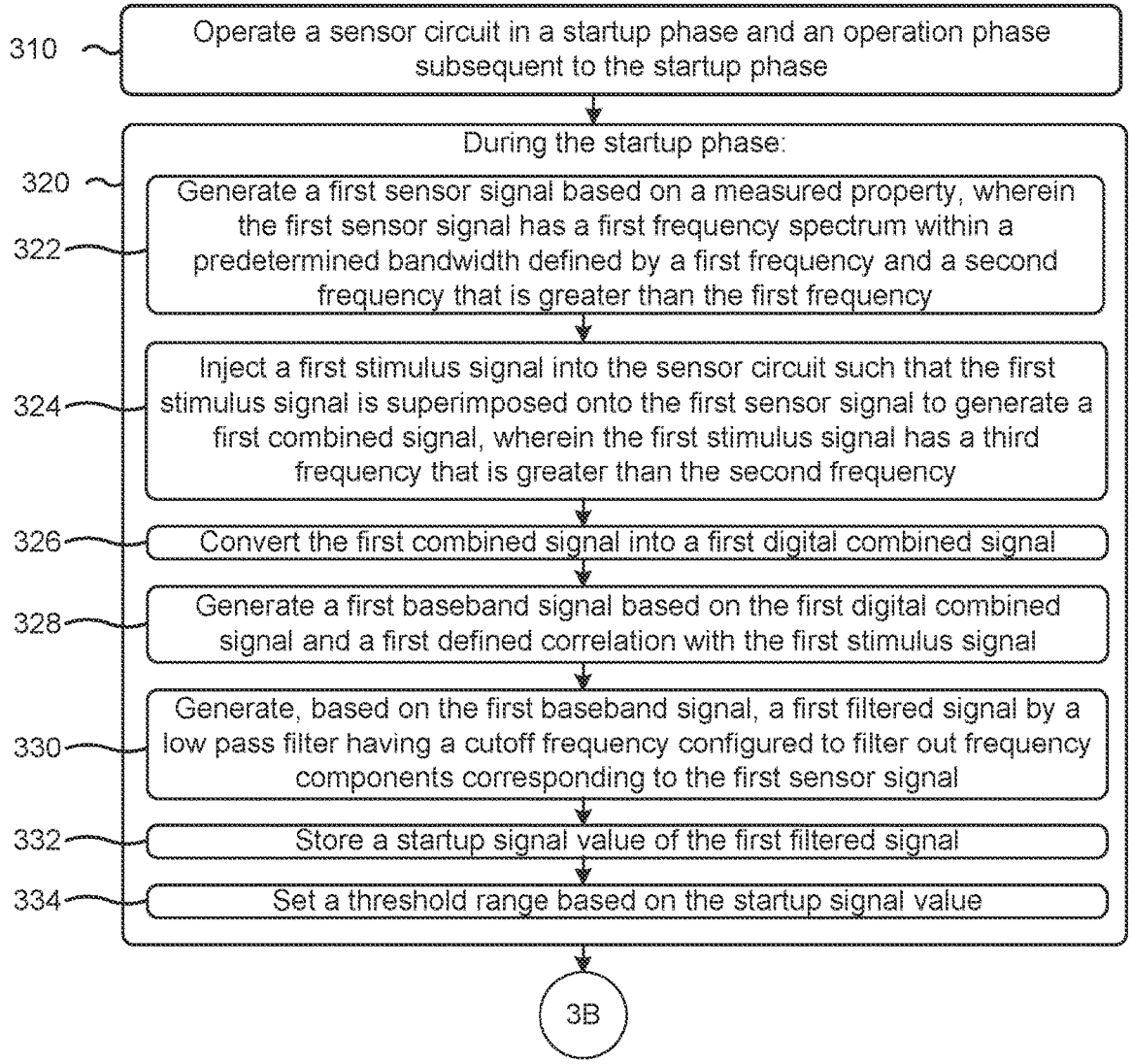
FIGS. 3A and 3B, together, illustrate a flowchart of an example process associated with a gain diagnosis of a sensor signal path.
Figure 3B:
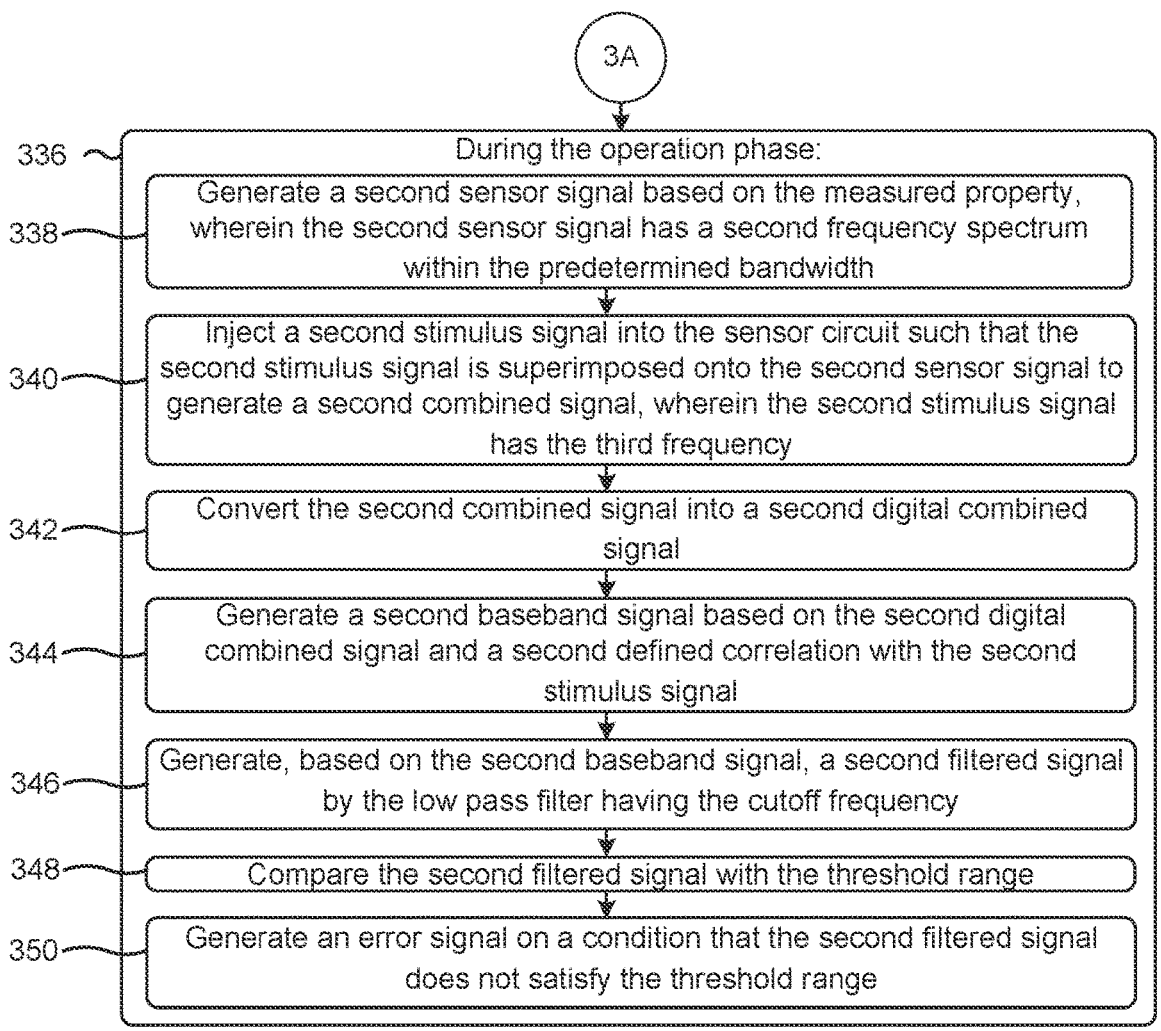

FIGS. 3A and 3B, together, illustrate a flowchart of an example process 300 associated with a gain diagnosis of a sensor signal path. For example, FIG. 3B is a continuation of process 300 from FIG. 3A. In some implementations, one or more process blocks of FIG. 3 are performed by a sensor circuit (e.g., sensor circuit 100). Additionally, or alternatively, one or more process blocks of FIGS. 3A and 3B may be performed by one or more components of the sensor circuit 100, such as the sensor 102, the buffer 104, the ADC 106, the gain diagnosis circuit 120, the signal generator 136, and the controller 138. As shown in FIG. 3A, process 300 may include operating a sensor circuit in a startup phase and an operation phase subsequent to the startup phase (block 310). For example, the controller 138 may operate the sensor circuit 100 in a startup phase and an operation phase subsequent to the startup phase, as described above.

As further shown in FIG. 3A, process 300 may include, during the startup phase (block 320), generating a first sensor signal based on a measured property, wherein the first sensor signal has a first frequency spectrum within a predetermined bandwidth defined by a first frequency and a second frequency that is greater than the first frequency (block 322); injecting a first stimulus signal into the sensor circuit such that the first stimulus signal is superimposed onto the first sensor signal to generate a first combined signal, wherein the first stimulus signal has a third frequency that is greater than the second frequency (block 324); converting the first combined signal into a first digital combined signal (block 326); generating a first baseband signal based on the first digital combined signal and a first defined correlation with the first stimulus signal (block 328); generating, based on the first baseband signal, a first filtered signal by a low pass filter having a cutoff frequency configured to filter out frequency components corresponding to the first sensor signal (block 330); storing a startup signal value of the first filtered signal (block 332); and setting a threshold range based on the startup signal value (block 334).

For example, the sensor circuit 100 may operate the sensor 102, the signal processing chain, the gain diagnosis circuit 120, and the signal generator 136 in the startup phase to perform the following: generate a first sensor signal based on a measured property, wherein the first sensor signal has a first frequency spectrum within a predetermined bandwidth defined by a first frequency and a second frequency that is greater than the first frequency; inject a first stimulus signal into the sensor circuit such that the first stimulus signal is superimposed onto the first sensor signal to generate a first combined signal, wherein the first stimulus signal has a third frequency that is greater than the second frequency; convert the first combined signal into a first digital combined signal; generate a first baseband signal based on the first digital combined signal and a first defined correlation with the first stimulus signal; generate, based on the first baseband signal, a first filtered signal by a low pass filter having a cutoff frequency configured to filter out frequency components corresponding to the first sensor signal; store a startup signal value of the first filtered signal; and set a threshold range based on the startup signal value, as described above.

As further shown in FIG. 3B, process 300 may include, during the operation phase (block 336), generating a second sensor signal based on the measured property, wherein the second sensor signal has a second frequency spectrum within the predetermined bandwidth (block 338); injecting a second stimulus signal into the sensor circuit such that the second stimulus signal is superimposed onto the second sensor signal to generate a second combined signal, wherein the second stimulus signal has the third frequency (block 340); converting the second combined signal into a second digital combined signal (block 342); generating a second baseband signal based on the second digital combined signal and a second defined correlation with the second stimulus signal (block 344); generating, based on the second baseband signal, a second filtered signal by the low pass filter having the cutoff frequency (block 346); comparing the second filtered signal with the threshold range (block 348); and generating an error signal on a condition that the second filtered signal does not satisfy the threshold range (block 350).

For example, the sensor circuit 100 may operate the sensor 102, the signal processing chain, the gain diagnosis circuit 120, and the signal generator 136 in the startup phase to perform the following: generate a second sensor signal based on the measured property, wherein the second sensor signal has a second frequency spectrum within the predetermined bandwidth; inject a second stimulus signal into the sensor circuit such that the second stimulus signal is superimposed onto the second sensor signal to generate a second combined signal, wherein the second stimulus signal has the third frequency; convert the second combined signal into a second digital combined signal; generate a second baseband signal based on the second digital combined signal and a second defined correlation with the second stimulus signal; generate, based on the second baseband signal, a second filtered signal by the low pass filter having the cutoff frequency; compare the second filtered signal with the threshold range; and generate an error signal on a condition that the second filtered signal does not satisfy the threshold range, as described above.

Although FIGS. 3A and 3B shows example blocks of process 300, in some implementations, process 300 includes additional blocks, fewer blocks, different blocks, or differently arranged blocks than those depicted in FIGS. 3A and 3B. Additionally, or alternatively, two or more of the blocks of process 300 may be performed in parallel.

The following provides an overview of some Aspects of the present disclosure:

Aspect 1: A sensor circuit having a startup phase and an operation phase subsequent to the startup phase, the sensor circuit comprising: a sensor configured to measure a property and generate a sensor signal based on the property, wherein the sensor signal has a frequency spectrum defined by a first frequency that is greater than zero and a second frequency that is greater than the first frequency; a signal processing circuit comprising an analog-to-digital converter (ADC) configured to convert the sensor signal into a digital sensor signal; and an offset diagnosis circuit coupled to an output of the ADC, wherein the offset diagnosis circuit comprises: a first low pass filter having a first cutoff frequency less than the first frequency and configured to generate a first filtered signal based on the digital sensor signal; an offset register configured to store a first startup signal value of the first filtered signal during the startup phase; and an offset comparator circuit configured to set a first threshold range based on the first startup signal value and, during the operation phase, compare the first filtered signal with the first threshold range and generate a first error signal on a condition that the first filtered signal does not satisfy the first threshold range during the operation phase.

Aspect 2: The sensor circuit of Aspect 1, wherein the sensor is an acoustic sensor, the property is an audio signal, the first frequency is in a first range of 16 Hz to 300 Hz, and the second frequency is in a second range of 3 kHz to 20 kHz.

Aspect 3: The sensor circuit of any of Aspects 1-2, wherein the offset comparator circuit is configured to generate the first error signal on a condition that the first filtered signal is outside the first threshold range during the operation phase.

Aspect 4: The sensor circuit of any of Aspects 1-3, wherein the first threshold range is defined by a first threshold greater than the first startup signal value by a first predetermined difference and a second threshold less than the first startup signal value by a second predetermined difference.

Aspect 5: The sensor circuit of any of Aspects 1-4, wherein the signal processing circuit comprises a second low pass filter coupled to the output of the ADC and configured to generate a sensor output signal based on the digital sensor signal, wherein the second low pass filter has a second cutoff frequency that is greater than the second frequency.

Aspect 6: The sensor circuit of any of Aspects 1-5, further comprising: a signal generator configured to inject a stimulus signal into the sensor circuit upstream from the ADC such that the stimulus signal is superimposed onto the sensor signal to generate a combined signal received by the ADC, wherein the stimulus signal has a third frequency that is greater than the second frequency, and wherein the ADC is configured to convert the combined signal into a digital combined signal; and a gain diagnosis circuit coupled to an output of the ADC, wherein the gain diagnosis circuit comprises: a demodulator configured to generate a baseband signal based on the digital combined signal and a defined correlation with the stimulus signal; a second low pass filter having a second cutoff frequency configured to filter out frequency components corresponding to the sensor signal, wherein the second low pass filter is configured to receive the baseband signal and generate a second filtered signal based on the baseband signal; a gain register configured to store a second startup signal value of the second filtered signal during the startup phase; and a gain comparator circuit configured to set a second threshold range based on the second startup signal value and, during the operation phase, compare the second filtered signal with the second threshold range and generate a second error signal on a condition that the second filtered signal does not satisfy the second threshold range during the operation phase. a demodulator configured to generate a baseband signal based on the digital combined signal and a defined correlation with the stimulus signal; a second low pass filter having a second cutoff frequency configured to filter out frequency components corresponding to the sensor signal, wherein the second low pass filter is configured to receive the baseband signal and generate a second filtered signal based on the baseband signal; a gain register configured to store a second startup signal value of the second filtered signal during the startup phase; and a gain comparator circuit configured to set a second threshold range based on the second startup signal value and, during the operation phase, compare the second filtered signal with the second threshold range and generate a second error signal on a condition that the second filtered signal does not satisfy the second threshold range during the operation phase.

Aspect 7: The sensor circuit of Aspect 6, wherein the frequency spectrum of the sensor signal is a first frequency spectrum, and wherein the stimulus signal has a second frequency spectrum that is entirely outside the first frequency spectrum of the sensor signal. wherein the stimulus signal has a second frequency spectrum that is entirely outside the first frequency spectrum of the sensor signal.

Aspect 8: The sensor circuit of Aspect 6, wherein: the demodulator is configured to demodulate the digital combined signal using a demodulation signal to generate the baseband signal, and the demodulation signal is in-phase with the stimulus signal and has a demodulation frequency equal to the third frequency.

Aspect 9: The sensor circuit of Aspect 6, wherein the gain comparator circuit is configured to generate the second error signal on a condition that the second filtered signal is outside the second threshold range during the operation phase.

Aspect 10: The sensor circuit of Aspect 6, wherein the second threshold range is defined by a first threshold greater than the second startup signal value by a first predetermined difference and a second threshold less than the second startup signal value by a second predetermined difference.

Aspect 11: The sensor circuit of Aspect 6, wherein the signal processing circuit comprises a third low pass filter coupled to the output of the ADC and configured to generate a sensor output signal based on the digital sensor signal, wherein the third low pass filter has a third cutoff frequency that is greater than the second cutoff frequency.

Aspect 12: The sensor circuit of Aspect 6, wherein the first low pass filter is configured to generate the first filtered signal based on the digital combined signal.

Aspect 13: The sensor circuit of Aspect 6, further comprising: a voltage source configured to provide an input bias voltage to the sensor, wherein the signal generator is configured to superimpose the stimulus signal onto the input bias voltage. wherein the signal generator is configured to superimpose the stimulus signal onto the input bias voltage.

Aspect 14: The sensor circuit of Aspect 6, further comprising: a buffer coupled between the sensor and the ADC, wherein the signal generator is configured inject the stimulus signal at a first injection point located between the sensor and the buffer or at a second injection point located between the buffer and the ADC. wherein the signal generator is configured inject the stimulus signal at a first injection point located between the sensor and the buffer or at a second injection point located between the buffer and the ADC.

Aspect 15: The sensor circuit of Aspect 6, wherein the second cutoff frequency is less than a difference between the third frequency and second frequency.

Aspect 16: A sensor circuit having a startup phase and an operation phase subsequent to the startup phase, the sensor circuit comprising: a sensor configured to measure a property and generate a sensor signal based on the property, wherein the sensor signal has a frequency spectrum defined by a first frequency and a second frequency that is greater than the first frequency; a signal processing circuit comprising an analog-to-digital converter (ADC); and a signal generator configured to inject a stimulus signal into the sensor circuit upstream from the ADC such that the stimulus signal is superimposed onto the sensor signal to generate a combined signal received by the ADC, wherein the stimulus signal has a third frequency that is greater than the second frequency, and wherein the ADC is configured to convert the combined signal into a digital combined signal; and a gain diagnosis circuit coupled to an output of the ADC, wherein the gain diagnosis circuit comprises: a demodulator configured to generate a baseband signal based on the digital combined signal and a defined correlation with the stimulus signal; a first low pass filter having a first cutoff frequency configured to filter out frequency components corresponding to the sensor signal, wherein the first low pass filter is configured to receive the baseband signal and generate a first filtered signal based on the baseband signal; a gain register configured to store a first startup signal value of the first filtered signal during the startup phase; and a gain comparator circuit configured to set a first threshold range based on the first startup signal value and, during the operation phase, compare the first filtered signal with the first threshold range and generate a first error signal on a condition that the first filtered signal does not satisfy the first threshold range during the operation phase.

Aspect 17: The sensor circuit of Aspect 16, wherein the first frequency is zero.

Aspect 18: The sensor circuit of any of Aspects 16-17, further comprising: an offset diagnosis circuit coupled to an output of the ADC, wherein the offset diagnosis circuit comprises: a second low pass filter having a second cutoff frequency less than the first frequency and configured to generate a second filtered signal based on the digital combined signal; an offset register configured to store a second startup signal value of the second filtered signal during the startup phase; and an offset comparator circuit configured to set a second threshold range based on the second startup signal value and, during the operation phase, compare the second filtered signal with the second threshold range and generate a second error signal on a condition that the second filtered signal does not satisfy the second threshold range during the operation phase. a second low pass filter having a second cutoff frequency less than the first frequency and configured to generate a second filtered signal based on the digital combined signal; an offset register configured to store a second startup signal value of the second filtered signal during the startup phase; and an offset comparator circuit configured to set a second threshold range based on the second startup signal value and, during the operation phase, compare the second filtered signal with the second threshold range and generate a second error signal on a condition that the second filtered signal does not satisfy the second threshold range during the operation phase.

Aspect 19: The sensor circuit of any of Aspects 16-18, wherein the sensor is an acoustic sensor, the property is an audio signal, the first frequency is in a range of 16 to 300 Hz, and the second frequency is in a range of 3 to 20 kHz.

Aspect 20: The sensor circuit of any of Aspects 16-19, wherein the first cutoff frequency is less than a difference between the third frequency and second frequency.

Aspect 21: A method, comprising: operating a sensor circuit in a startup phase and an operation phase subsequent to the startup phase, wherein operating the sensor circuit in the startup phase comprises: generating a first sensor signal based on a measured property, wherein the first sensor signal has a first frequency spectrum within a predetermined bandwidth defined by a first frequency and a second frequency that is greater than the first frequency; converting the first sensor signal into a first digital sensor signal; generating, based on the first digital sensor signal, a first filtered signal by a low pass filter having a cutoff frequency that is less than the first frequency; storing a startup signal value of the first filtered signal; and setting a threshold range based on the startup signal value, and wherein operating the sensor circuit in the operation phase comprises: generating a second sensor signal based on the measured property, wherein the second sensor signal has a second frequency spectrum within the predetermined bandwidth; converting the second sensor signal into a second digital sensor signal; generating, based on the second digital sensor signal, a second filtered signal by the low pass filter having the cutoff frequency; comparing the second filtered signal with the threshold range; and generating an error signal on a condition that the second filtered signal does not satisfy the threshold range.

Aspect 22: The method of Aspect 21, wherein a target frequency range of the measured property is limited to the predetermined bandwidth.

Aspect 23: A method, comprising: operating a sensor circuit in a startup phase and an operation phase subsequent to the startup phase, wherein operating the sensor circuit in the startup phase comprises: generating a first sensor signal based on a measured property, wherein the first sensor signal has a first frequency spectrum within a predetermined bandwidth defined by a first frequency and a second frequency that is greater than the first frequency; injecting a first stimulus signal into the sensor circuit such that the first stimulus signal is superimposed onto the first sensor signal to generate a first combined signal, wherein the first stimulus signal has a third frequency that is greater than the second frequency; converting the first combined signal into a first digital combined signal; generating a first baseband signal based on the first digital combined signal and a first defined correlation with the first stimulus signal; generating, based on the first baseband signal, a first filtered signal by a low pass filter having a cutoff frequency configured to filter out frequency components corresponding to the first sensor signal; storing a startup signal value of the first filtered signal; and setting a threshold range based on the startup signal value, wherein operating the sensor circuit in the operation phase comprises: generating a second sensor signal based on the measured property, wherein the second sensor signal has a second frequency spectrum within the predetermined bandwidth; injecting a second stimulus signal into the sensor circuit such that the second stimulus signal is superimposed onto the second sensor signal to generate a second combined signal, wherein the second stimulus signal has the third frequency; converting the second combined signal into a second digital combined signal; generating a second baseband signal based on the second digital combined signal and a second defined correlation with the second stimulus signal; generating, based on the second baseband signal, a second filtered signal by the low pass filter having the cutoff frequency; comparing the second filtered signal with the threshold range; and generating an error signal on a condition that the second filtered signal does not satisfy the threshold range.

Aspect 24: The method of Aspect 23, wherein a target frequency range of the measured property is limited to the predetermined bandwidth.

Aspect 25: The method of any of Aspects 23-24, wherein the cutoff frequency is less than a difference between the third frequency and second frequency.

Aspect 26: A system configured to perform one or more operations recited in one or more of Aspects 1-25.

Aspect 27: An apparatus comprising means for performing one or more operations recited in one or more of Aspects 1-25.

Aspect 28: A non-transitory computer-readable medium storing a set of instructions, the set of instructions comprising one or more instructions that, when executed by a device, cause the device to perform one or more operations recited in one or more of Aspects 1-25.

Aspect 29: A computer program product comprising instructions or code for executing one or more operations recited in one or more of Aspects 1-25.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein refers to any of the foregoing structures or any other structure suitable for implementation of the techniques described herein.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A sensor circuit having a startup phase and an operation phase subsequent to the startup phase, the sensor circuit comprising:
a sensor configured to measure a property and generate a sensor signal based on the property, wherein the sensor signal has a frequency spectrum defined by a first frequency that is greater than zero and a second frequency that is greater than the first frequency;

a signal processing circuit comprising an analog-to-digital converter (ADC) configured to convert the sensor signal into a digital sensor signal; and an offset diagnosis circuit coupled to an output of the ADC, wherein the offset diagnosis circuit comprises:
- a first low pass filter having a first cutoff frequency less than the first frequency and configured to generate a first filtered signal based on the digital sensor signal;
- an offset register configured to store a first startup signal value of the first filtered signal during the startup phase; and
- an offset comparator circuit configured to set a first threshold range based on the first startup signal value and, during the operation phase, compare the first filtered signal with the first threshold range and generate a first error signal on a condition that the first filtered signal does not satisfy the first threshold range during the operation phase.

2. The sensor circuit of claim 1, wherein the sensor is an acoustic sensor, the property is an audio signal, the first frequency is in a first range of 16 Hz to 300 Hz, and the second frequency is in a second range of 3 kHz to 20 kHz.

3. The sensor circuit of claim 1, wherein the offset comparator circuit is configured to generate the first error signal on a condition that the first filtered signal is outside the first threshold range during the operation phase.

4. The sensor circuit of claim 1, wherein the first threshold range is defined by a first threshold greater than the first startup signal value by a first predetermined difference and a second threshold less than the first startup signal value by a second predetermined difference.

5. The sensor circuit of claim 1, wherein the signal processing circuit comprises a second low pass filter coupled to the output of the ADC and configured to generate a sensor output signal based on the digital sensor signal, wherein the second low pass filter has a second cutoff frequency that is greater than the second frequency.

6. The sensor circuit of claim 1, further comprising:
a signal generator configured to inject a stimulus signal into the sensor circuit upstream from the ADC such that the stimulus signal is superimposed onto the sensor signal to generate a combined signal received by the ADC, wherein the stimulus signal has a third frequency that is greater than the second frequency, and wherein the ADC is configured to convert the combined signal into a digital combined signal; and
a gain diagnosis circuit coupled to an output of the ADC, wherein the gain diagnosis circuit comprises:
- a demodulator configured to generate a baseband signal based on the digital combined signal and a defined correlation with the stimulus signal;
- a second low pass filter having a second cutoff frequency configured to filter out frequency components corresponding to the sensor signal, wherein the second low pass filter is configured to receive the baseband signal and generate a second filtered signal based on the baseband signal;
- a gain register configured to store a second startup signal value of the second filtered signal during the startup phase; and
- a gain comparator circuit configured to set a second threshold range based on the second startup signal value and, during the operation phase, compare the second filtered signal with the second threshold range and generate a second error signal on a condition that the second filtered signal does not satisfy the second threshold range during the operation phase.

7. The sensor circuit of claim 6, wherein the frequency spectrum of the sensor signal is a first frequency spectrum, and
wherein the stimulus signal has a second frequency spectrum that is entirely outside the first frequency spectrum of the sensor signal.

8. The sensor circuit of claim 6, wherein:
the demodulator is configured to demodulate the digital combined signal using a demodulation signal to generate the baseband signal, and
the demodulation signal is in-phase with the stimulus signal and has a demodulation frequency equal to the third frequency.

9. The sensor circuit of claim 6, wherein the gain comparator circuit is configured to generate the second error signal on a condition that the second filtered signal is outside the second threshold range during the operation phase.

10. The sensor circuit of claim 6, wherein the second threshold range is defined by a first threshold greater than the second startup signal value by a first predetermined difference and a second threshold less than the second startup signal value by a second predetermined difference.

11. The sensor circuit of claim 6, wherein the signal processing circuit comprises a third low pass filter coupled to the output of the ADC and configured to generate a sensor output signal based on the digital sensor signal, wherein the third low pass filter has a third cutoff frequency that is greater than the second cutoff frequency.

12. The sensor circuit of claim 6, wherein the first low pass filter is configured to generate the first filtered signal based on the digital combined signal.

13. The sensor circuit of claim 6, further comprising:
a voltage source configured to provide an input bias voltage to the sensor,
wherein the signal generator is configured to superimpose the stimulus signal onto the input bias voltage.

14. The sensor circuit of claim 6, further comprising:
a buffer coupled between the sensor and the ADC,
wherein the signal generator is configured inject the stimulus signal at a first injection point located between the sensor and the buffer or at a second injection point located between the buffer and the ADC.

15. The sensor circuit of claim 6, wherein the second cutoff frequency is less than a difference between the third frequency and the second frequency.

16. A sensor circuit having a startup phase and an operation phase subsequent to the startup phase, the sensor circuit comprising:
a sensor configured to measure a property and generate a sensor signal based on the property, wherein the sensor signal has a frequency spectrum defined by a first frequency and a second frequency that is greater than the first frequency;
a signal processing circuit comprising an analog-to-digital converter (ADC); and
a signal generator configured to inject a stimulus signal into the sensor circuit upstream from the ADC such that the stimulus signal is superimposed onto the sensor signal to generate a combined signal received by the ADC, wherein the stimulus signal has a third frequency that is greater than the second frequency, and wherein the ADC is configured to convert the combined signal into a digital combined signal; and a gain diagnosis circuit coupled to an output of the ADC, wherein the gain diagnosis circuit comprises:
  a demodulator configured to generate a baseband signal based on the digital combined signal and a defined correlation with the stimulus signal;
  a first low pass filter having a first cutoff frequency configured to filter out frequency components corresponding to the sensor signal, wherein the first low pass filter is configured to receive the baseband signal and generate a first filtered signal based on the baseband signal;
  a gain register configured to store a first startup signal value of the first filtered signal during the startup phase; and
  a gain comparator circuit configured to set a first threshold range based on the first startup signal value and, during the operation phase, compare the first filtered signal with the first threshold range and generate a first error signal on a condition that the first filtered signal does not satisfy the first threshold range during the operation phase.

17. The sensor circuit of claim 16, wherein the first frequency is zero.

18. The sensor circuit of claim 16, further comprising:
an offset diagnosis circuit coupled to an output of the ADC, wherein the offset diagnosis circuit comprises:
  a second low pass filter having a second cutoff frequency less than the first frequency and configured to generate a second filtered signal based on the digital combined signal;
  an offset register configured to store a second startup signal value of the second filtered signal during the startup phase; and
  an offset comparator circuit configured to set a second threshold range based on the second startup signal value and, during the operation phase, compare the second filtered signal with the second threshold range and generate a second error signal on a condition that the second filtered signal does not satisfy the second threshold range during the operation phase.

19. The sensor circuit of claim 16, wherein the sensor is an acoustic sensor, the property is an audio signal, the first frequency is in a range of 16 to 300 Hz, and the second frequency is in a range of 3 to 20 kHz.

20. The sensor circuit of claim 16, wherein the first cutoff frequency is less than a difference between the third frequency and second frequency.

21. A method, comprising:
operating a sensor circuit in a startup phase and an operation phase subsequent to the startup phase,
wherein operating the sensor circuit in the startup phase comprises:
  generating a first sensor signal based on a measured property, wherein the first sensor signal has a first frequency spectrum within a predetermined bandwidth defined by a first frequency and a second frequency that is greater than the first frequency;
  converting the first sensor signal into a first digital sensor signal;
  generating, based on the first digital sensor signal, a first filtered signal by a low pass filter having a cutoff frequency that is less than the first frequency;
  storing a startup signal value of the first filtered signal; and
  setting a threshold range based on the startup signal value, and wherein operating the sensor circuit in the operation phase comprises:
  generating a second sensor signal based on the measured property, wherein the second sensor signal has a second frequency spectrum within the predetermined bandwidth;
  converting the second sensor signal into a second digital sensor signal;
  generating, based on the second digital sensor signal, a second filtered signal by the low pass filter having the cutoff frequency;
  comparing the second filtered signal with the threshold range; and
  generating an error signal on a condition that the second filtered signal does not satisfy the threshold range.

22. The method of claim 21, wherein a target frequency range of the measured property is limited to the predetermined bandwidth.

23. A method, comprising:
operating a sensor circuit in a startup phase and an operation phase subsequent to the startup phase,
wherein operating the sensor circuit in the startup phase comprises:
  generating a first sensor signal based on a measured property, wherein the first sensor signal has a first frequency spectrum within a predetermined bandwidth defined by a first frequency and a second frequency that is greater than the first frequency;
  injecting a first stimulus signal into the sensor circuit such that the first stimulus signal is superimposed onto the first sensor signal to generate a first combined signal, wherein the first stimulus signal has a third frequency that is greater than the second frequency;
  converting the first combined signal into a first digital combined signal;
  generating a first baseband signal based on the first digital combined signal and a first defined correlation with the first stimulus signal;
  generating, based on the first baseband signal, a first filtered signal by a low pass filter having a cutoff frequency configured to filter out frequency components corresponding to the first sensor signal;
  storing a startup signal value of the first filtered signal; and
  setting a threshold range based on the startup signal value, and wherein operating the sensor circuit in the operation phase comprises:
  generating a second sensor signal based on the measured property, wherein the second sensor signal has a second frequency spectrum within the predetermined bandwidth;
  injecting a second stimulus signal into the sensor circuit such that the second stimulus signal is superimposed onto the second sensor signal to generate a second combined signal, wherein the second stimulus signal has the third frequency;
  converting the second combined signal into a second digital combined signal;
  generating a second baseband signal based on the second digital combined signal and a second defined correlation with the second stimulus signal;
  generating, based on the second baseband signal, a second filtered signal by the low pass filter having the cutoff frequency;

comparing the second filtered signal with the threshold range; and generating an error signal on a condition that the second filtered signal does not satisfy the threshold range.

24. The method of claim 23, wherein a target frequency range of the measured property is limited to the predetermined bandwidth.

25. The method of claim 23, wherein the cutoff frequency is less than a difference between the third frequency and the second frequency.

* * * * *